(12) United States Patent
Fujimura et al.

(10) Patent No.: US 9,220,137 B2
(45) Date of Patent: Dec. 22, 2015

(54) METHOD FOR DRIVING A LIGHT-EMITTING UNIT AND CIRCUIT THEREFOR

(71) Applicant: Semiconductor Components Industries, LLC, Phoenix, AZ (US)

(72) Inventors: Yoshio Fujimura, Ota (JP); Hiroshi Iizuka, Honjou (JP); Kazunari Kushiyama, Ora-gun (JP); Koudai Nakamura, Ora-gun (JP); Yuusuke Nishizaki, Ora-gun (JP); Kenpei En, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 79 days.

(21) Appl. No.: 14/194,811

(22) Filed: Mar. 2, 2014

(65) Prior Publication Data
US 2014/0175994 A1 Jun. 26, 2014

Related U.S. Application Data

(63) Continuation of application No. 12/607,754, filed on Oct. 28, 2009, now Pat. No. 8,665,922.

(30) Foreign Application Priority Data

Oct. 31, 2008 (JP) .................................. 2008-282189
Nov. 14, 2008 (JP) .................................. 2008-292125
Nov. 27, 2008 (JP) .................................. 2008-303078

(51) Int. Cl.
*H01S 3/00* (2006.01)
*H05B 33/08* (2006.01)
*H01S 5/042* (2006.01)

(52) U.S. Cl.
CPC ............ *H05B 33/0815* (2013.01); *H01S 5/042* (2013.01); *H05B 33/0818* (2013.01); *H05B 33/0824* (2013.01); *H05B 33/0848* (2013.01); *Y02B 20/347* (2013.01)

(58) Field of Classification Search
CPC ................................ H01S 3/10; H01S 3/10015
USPC ...................... 372/38.01–38.04, 38.07, 38.09
See application file for complete search history.

(56) References Cited

U.S. PATENT DOCUMENTS

| 5,936,599 A | 8/1999 | Reymond |
| 6,320,330 B1 | 11/2001 | Haavisto et al. |

(Continued)

FOREIGN PATENT DOCUMENTS

| JP | H01217494 A | 8/1989 |
| JP | H07-131322 A | 5/1995 |

(Continued)

OTHER PUBLICATIONS

Office Action in Japanese Patent Application No. 2008-303078, having a mailing date of Sep. 4, 2012, and English translation thereof (4 pages).

(Continued)

*Primary Examiner* — Yuanda Zhang
(74) *Attorney, Agent, or Firm* — Rennie William Dover

(57) ABSTRACT

A driver circuit is provided which comprises a series-connected unit having a light-emitting element and a current limiting inductor directly connected to the light-emitting element, a regenerative diode which is connected in parallel to the series-connected unit and which regenerates energy stored in the current limiting inductor, a transistor which controls a current flowing through the light-emitting element and the current limiting inductor, and a controller which controls an operation of the transistor, wherein the controller controls the transistor according to a voltage value of a power supply applied to the light-emitting element.

18 Claims, 12 Drawing Sheets

(56) References Cited

U.S. PATENT DOCUMENTS

| | | |
|---|---|---|
| 2002/0158590 A1 | 10/2002 | Sailto et al. |
| 2003/0016711 A1 | 1/2003 | Crawford |
| 2003/0085749 A1 | 5/2003 | Xu et al. |
| 2003/0107324 A1 | 6/2003 | Cho et al. |
| 2004/0007991 A1* | 1/2004 | Ryu et al. .................. 315/291 |
| 2004/0218410 A1 | 11/2004 | Yamada et al. |
| 2006/0072324 A1 | 4/2006 | Hachiya et al. |

FOREIGN PATENT DOCUMENTS

| | | |
|---|---|---|
| JP | H09-074346 A | 3/1997 |
| JP | 2000-232241 A | 8/2000 |
| JP | 2002-184588 A | 6/2002 |
| JP | 2004-119078 A | 4/2004 |
| JP | 2006-108260 A | 4/2006 |
| JP | 2006-147184 A | 6/2006 |
| JP | 2007-073781 A | 3/2007 |
| JP | 2007-142057 A | 6/2007 |
| JP | 2007220812 A | 8/2007 |
| WO | 0145470 A1 | 6/2001 |

OTHER PUBLICATIONS

English Patent Abstract of JP 2007073781 from esp@cenet, Publication Date: Mar. 22, 2007 (1 Page).

English Patent Abstract of JP 2000232241 from esp@cenet, Publication Date: Aug. 22, 2012 (1 Page).

English Patent Abstract of JP 2007142057 from esp@cenet, Publication Date: Jun. 7, 2007 (1 Page).

Office Action in Korean Patent Application No. 10-2009-104246, Dated Mar. 4, 2011 (6 Pages with English Translation).

English Patent Abstract of JP 2007220812 from esp@cenet, Publication Date Aug. 30, 2007 (1 Page).

English Patent Abstract of JP 2002184588 from esp@cenet, Publication Date: Jun. 28, 2002 (1 Page).

Notice of Grounds for Rejection issued in JP Application No. 2008-292125, mailed on Sep. 10, 2013, and translation thereof (4 pages).

Espacenet Abstract, Publication No. JPH07131322A dated May 19, 1995 (1 page).

Espacenet Abstract, Publication No. JPH0974346A dated Mar. 18, 1997 (1 page).

Notice of Grounds for Rejection in corresponding Japanese application No. 2008-292125 dated Jun. 4, 2013 (4 pages).

Espacenet Abstract, Publication No. WO0145470 A1 dated Jun. 21, 2001 (1 page).

Espacenet Abstract, Publication No. JP2006108260 A dated Apr. 20, 2006 (1 page).

Espacenet Abstract, Publication No. JP2006147184 A dated Jun. 8, 2006 (1 page).

Espacenet Abstract, Publication No. JPH01217494 A dated Aug. 31, 1989 (1 page).

Office Action in Japanese Patent Application No. 2008-282189, mailing date Apr. 23, 2013, with English translation thereof (4 pages).

* cited by examiner

US 9,220,137 B2

METHOD FOR DRIVING A LIGHT-EMITTING UNIT AND CIRCUIT THEREFOR

The present application is a continuation application of U.S. patent application Ser. No. 12/607,754 filed on Oct. 28, 2009, by Yoshio Fujimura et al., titled "Driver Circuit of Light-Emitting Element" which is hereby incorporated by reference in its entirety, and priority thereto for common subject matter is hereby claimed.

CROSS-REFERENCE TO RELATED APPLICATIONS

The entire disclosure of Japanese Patent Application Nos. 2008-282189, 2008-292125, and 2008-303078 including specification, claims, drawings, and abstract is incorporated herein by reference.

BACKGROUND OF THE INVENTION

1. Field of the Invention

The present invention relates to a driver circuit of a light-emitting element.

2. Description of the Related Art

With the development of a light-emitting element such as a light-emitting diode, a driver circuit has been conceived which drives a light source which emits light and in which a plurality of light-emitting elements are connected in series.

As shown in FIG. 8, a driver circuit 100 of related art comprises a rectifying bridge 10, a controller 12, a current controlling inductor 14, a transistor 16, and a regenerative diode 18.

The current controlling inductor 14 is connected in series to a series-connected structure 102 of a plurality of light-emitting elements to be driven. When the light-emitting element is the light-emitting diode (LED), the light-emitting diodes are connected in series with the forward directions aligned with each other. The regenerative diode 18 is connected in parallel to the current controlling inductor 14 and the series-connected structure 102 of light emitting elements. The transistor 16 is connected in series to the current controlling inductor 14 and the series-connected structure 102 of light-emitting elements, to control a current flowing in the light-emitting element included in the LED-connected section 102 and the inductor.

A power supply voltage is applied from the rectifying bridge 10 to the series-connected structure 102 of the light-emitting elements and the current controlling inductor 14. When the controller 12 sets a gate voltage of the transistor 16 to a high level, the transistor 16 is set in the ON state. With this process, as shown in FIG. 9, a voltage Vds between the drain and source of the transistor 16 is reduced, and, because of the current limiting action of the current controlling inductor 14, the current ID flowing through the series-connected structure 102 of light-emitting elements and the current controlling inductor 14 gradually increases. The controller 12 switches the gate voltage of the transistor 16 to a low level before the current ID exceeds a rated value of each light-emitting element. With this process, the transistor 16 is set to the OFF state, the voltage Vds between the drain and source of the transistor 16 becomes the power supply voltage Vdc, and the current ID is reduced. The energy stored in the current controlling inductor 14 during the OFF state is regenerated to the power supply by a regenerative current Ioff via the regenerative diode 18. In this manner, by controlling switching of the transistor 16 by the controller 12, it is possible to emit light while maintaining the current of light-emitting element to be less than or equal to the rated value by the function of the current controlling inductor 14.

In the driver circuit 100 of the related art, a full-wave rectified power supply voltage is supplied from the rectifying bridge 10. In this process, as shown in FIG. 10A, in a region A in which the power supply voltage is low, there has been a possibility of abnormal oscillation of the switching of the transistor 16.

In consideration of this, as shown in FIG. 11, a capacitor C for averaging the power supply voltage may be connected on an output side of the rectifying bridge 10, to apply a measure to average the power supply voltage, as shown in FIG. 10B. However, with the provision of the capacitor C, another problem is caused in which a power factor of the driver circuit 100 is reduced.

In addition, in the driver circuit 100 of the related art, when the controller 12 switches the transistor 16 from the OFF state to the ON state, the voltage applied to the series-connected structure 102 of light-emitting elements, the current controlling inductor 14, and the transistor 16 rapidly changes. Because of this, as shown in FIG. 12, spike-like noise may occur at a rising portion of the current ID.

Moreover, in the driver circuit 100 of related art, a power supply is supplied from the rectifying bridge 10 through a limiting resistor Rstart to the controller 12. In such a structure of the driver circuit 100, even when the number of series connections of the light-emitting elements is increased and the power supply voltage Vds is increased, the power supply voltage supplied to the controller 12 is still maintained at a low value. As a result, the electric power consumed by the limiting resistor Rstart is increased and efficiency of the overall circuit is reduced.

For example, when a commercial AC power supply of 100 V is rectified by the rectifying bridge 10 and a power supply voltage Vdc of approximately 120 V is to be supplied, if the number of connections of the light-emitting elements is increased and light-emitting elements of a few tens of watts (W) to a few hundred watts (W) are to be driven, the controller 12 must drive the transistor 16 with a current capacity of approximately 100 mA. In such a state, electric power of approximately 10 W would be consumed at the limiting resistor Rstart, and the overall power efficiency of the driver circuit 100 is reduced.

SUMMARY OF THE INVENTION

According to one aspect of the present invention, there is provided a driver circuit of a light-emitting element, comprising a series-connected unit having a light-emitting element and a current limiting inductor directly connected to the light-emitting element, a regenerative unit which is connected in parallel to the series-connected unit and which regenerates energy stored in the current limiting inductor, a switching element which controls a current flowing through the light-emitting element and the current limiting inductor, and a controller which controls an operation of the switching element, wherein the controller controls the switching element according to a voltage value of a power supply applied to the light-emitting element.

According to another aspect of the present invention, there is provided a driver circuit of a light-emitting element, comprising a series-connected unit having a light-emitting element and a current limiting inductor directly connected to the light-emitting element, a regenerative unit which is connected in parallel to the series-connected unit and which regenerates energy stored in the current limiting inductor, a switching element which controls a current flowing through the light-emitting element and the current limiting inductor, a controller which controls an operation of the switching element, and a timing inductor which is electromagnetically coupled to the current limiting inductor and which outputs a control signal to the controller, wherein the controller controls a timing of switching of the switching element according to the control signal.

According to another aspect of the present invention, there is provided a driver circuit of a light-emitting element, comprising a series-connected unit having a light-emitting element and a current limiting inductor directly connected to the light-emitting element, a regenerative unit which is connected in parallel to the series-connected unit and which regenerates energy stored in the current limiting inductor, a switching element which controls a current flowing through the light-emitting element and the current limiting inductor, a controller which controls an operation of the switching element, and a power supply inductor which is electromagnetically coupled to the current limiting inductor and which supplies at least a part of an electric power of a power supply to the controller.

BRIEF DESCRIPTION OF THE DRAWINGS

Preferred embodiments of the present invention will be described in further detail based on the following drawings, wherein.

DESCRIPTION OF THE PREFERRED EMBODIMENTS

<First Preferred Embodiment>

Figure 1:
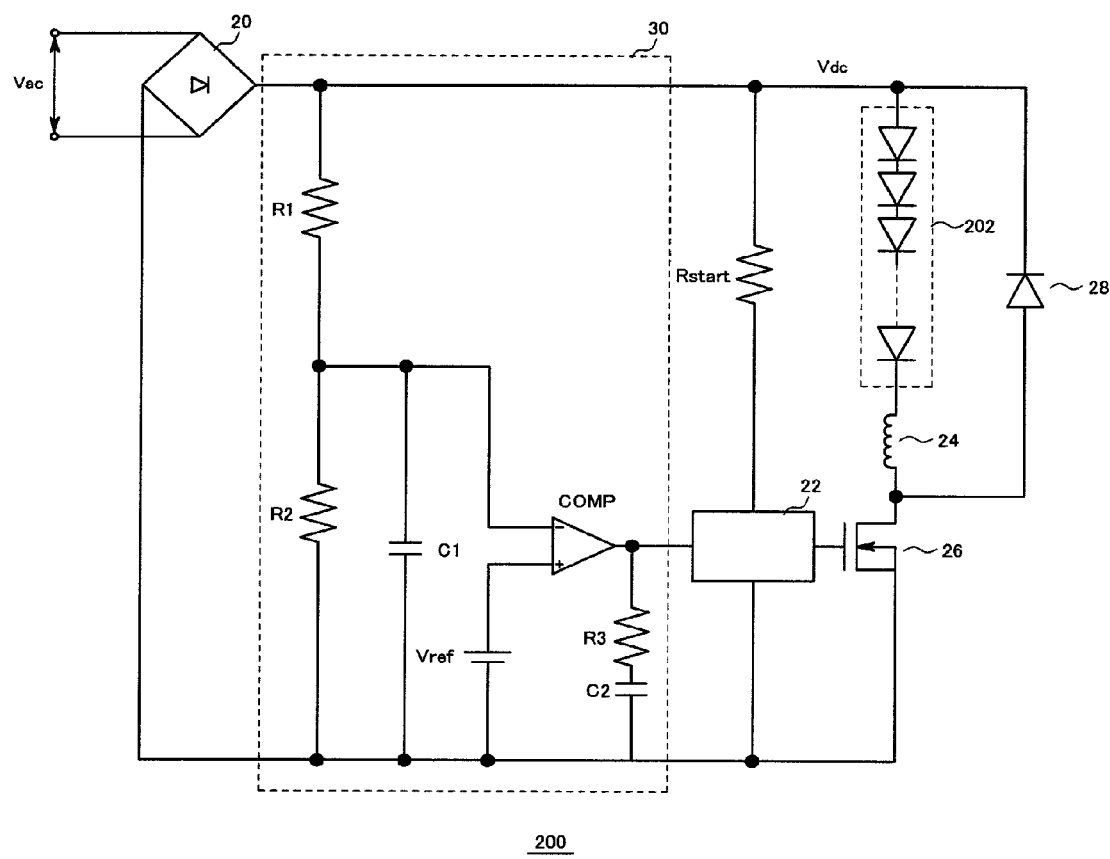
FIG. 1 is a diagram showing a structure of a driver circuit of a light-emitting element in a first preferred embodiment of the present invention.

As shown in FIG. 1, a driver circuit 200 according to a first preferred embodiment of the present invention comprises a rectifying bridge 20, a controller 22, a current limiting inductor 24, a transistor 26, a regenerative diode 28, and an oscillation preventing circuit 30.

The rectifying bridge 20 is a circuit in which a rectifying diode is connected in a bridge shape, and an input alternate current power supply voltage Vac is full-wave rectified and output as a direct current power supply voltage Vdc. In the rectifying bridge 20, an averaging circuit for averaging the full-wave rectified power supply voltage may be provided.

A light-emitting element to be driven by the driver circuit 200 may be a light-emitting diode (LED), laser diode (LD), etc. Alternatively, a series-connected structure 202 in which a plurality of light-emitting elements are connected in series may be driven. If the light-emitting element is a light-emitting diode (LED), when the series-connected structure 202 of light-emitting elements is formed, the light-emitting diodes are connected in series such that the forward directions are aligned with each other. In addition, the series-connected structures 202 may be connected in parallel.

The current limiting inductor 24 is connected in series to the series-connected structure 202 of a plurality of light-emitting elements to be driven. The regenerative diode 28 is connected in parallel to the current limiting inductor 24 and the series-connected structure 202 of light-emitting elements.

The transistor 26 is a switching element in which the ON state and the OFF state are controlled by the controller 22. The transistor 26 is connected in series to the current limiting inductor 24 and the series-connected structure 202 of light-emitting elements. A power supply voltage Vdc is applied from the rectifying bridge 20 to the series-connected structure 202 of light-emitting elements and the current limiting inductor 24 through the drain and source of the transistor 26. The controller 22 is connected to the gate of the transistor 26. The controller 22 controls ON and OFF states of the transistor 26 at predetermined timings, to intermittently supply power to the light-emitting element and cause the light-emitting element to emit light.

When the transistor 26 is controlled to the ON state, a current is supplied to the current limiting inductor 24 and the series-connected structure 202 through the drain and the source. In this process, because of the action of the current limiting inductor 24, the current flowing in the light-emitting element is limited to gradually increase. On the other hand, when the transistor 26 is controlled to the OFF state, the drain and source are cut off, and the electromagnetic energy stored in the current limiting inductor 24 is regenerated to the power supply through the regenerative diode 28.

In this process, the controller 22 controls the frequency or pulse width of switching of transistor 26 so that the operation of each light-emitting element is limited to less than or equal to the rated value, with the function of the current limiting inductor 24. With this configuration, the light-emitting element can suitably emit light.

In the driver circuit 200 in the present embodiment, the oscillation preventing circuit 30 is provided. The oscillation preventing circuit 30 continuously detects the rectified power supply voltage Vdc, and controls switching of the transistor 26 by the controller 22 according to the power supply voltage Vdc. More specifically, the oscillation preventing circuit 30 stops switching of the transistor 26 when the power supply voltage Vdc is low.

The oscillation preventing circuit 30 may comprise, as shown in FIG. 1, resistors R1, R2, and R3, capacitors C1 and C2, and a comparator COMP. The resistors R1 and R2 are connected in series, and are connected in parallel between output terminals of the rectifying bridge 20. A connecting point of the resistors R1 and R2 is connected to an inverteing input terminal (−) of the comparator COMP. The connecting point of the resistors R1 and R2 is grounded through the capacitor C1. An output terminal of the comparator COMP is grounded through a series connection of the resistor R3 and the capacitor C2. In addition, a reference voltage Vref is applied to a non-inverting input terminal (+) of the comparator COMP.

Figure 2:
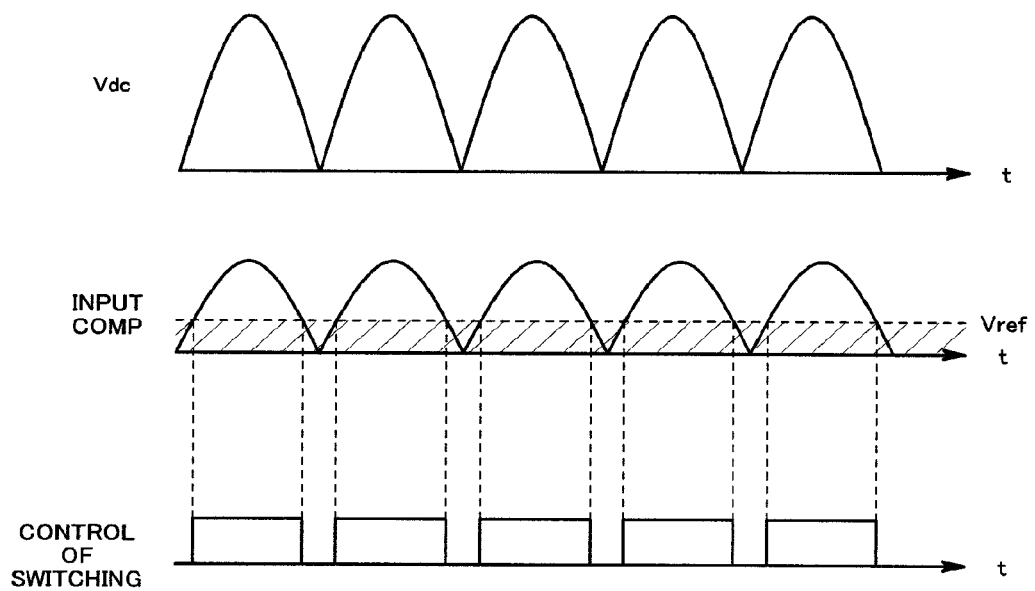
FIG. 2 is a timing chart showing an operation of a driver circuit of a light-emitting element in the first preferred embodiment of the present invention.

An output of the rectifying bridge 20 is divided by the resistors R1 and R2. When the power supply voltage Vdc which is output by the rectifying bridge 20 is reduced, the voltage of the resistor R2 is reduced. As shown in FIG. 2, when the voltage which is input to the inverting input terminal (−) of the comparator COMP becomes less than the reference voltage Vref, the voltage on the output terminal of the comparator COMP becomes the low level. Upon reception of this output of the comparator COMP, the controller 22 stops switching of the transistor 26.

When, on the other hand, the power supply voltage Vdc is increased, the voltage of the resistor R2 is also increased. As shown in FIG. 2, when the voltage which is input to the inverting input terminal (−) of the comparator COMP becomes greater than or equal to the reference voltage Vref, the voltage on the output terminal of the comparator COMP becomes the high level. Upon reception of this output of the comparator COMP, the controller 22 resumes the switching of the transistor 26.

In this manner, by stopping the switching of the transistor 26 in a region where the power supply voltage Vdc is low, it is possible to inhibit abnormal oscillation. In addition, it is not necessary to provide a large-capacity capacitor for averaging the power supply voltage Vdc, and it is thus possible to prevent reduction of the overall power factor of the driver circuit 200.

In addition, by intentionally changing the reference voltage Vref, it is possible to change the time when the LED emits light or the current in the LED at the frequency synchronized with the commercial frequency, and, as a result, the amount of light changes. With this structure, it is possible to adjust the light of the LED.

<Second Preferred Embodiment>

Figure 3:
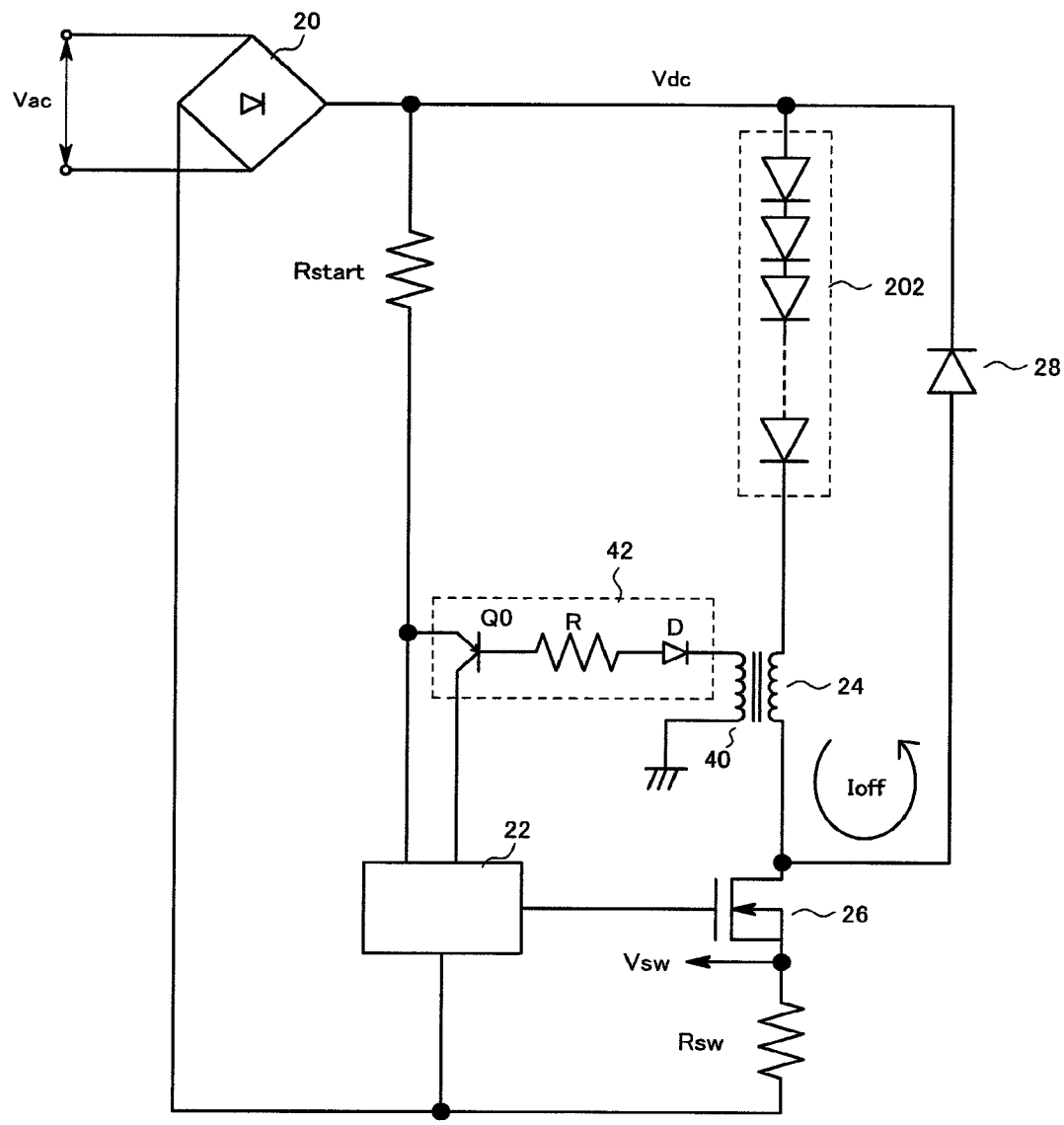
FIG. 3 is a diagram showing a structure of a driver circuit of a light-emitting element according to a second preferred embodiment of the present invention.

A driver circuit 204 according to a second preferred embodiment of the present invention comprises, as shown in FIG. 3, a rectifying bridge 20, a controller 22, a current limiting inductor 24, a transistor 26, a regenerative diode 28, a timing inductor 40, and a timing detecting circuit 42.

The same constituent elements as those in the driver circuit 200 of the first preferred embodiment are assigned the same reference numerals, and will not be described again.

In the driver circuit 204 of the present embodiment, the timing inductor 40 is electromagnetically coupled to the current limiting inductor 24. One terminal of the timing inductor 40 is connected to the controller 22 via the timing detecting circuit 42, and the other terminal is grounded.

The timing detecting circuit 42 is a circuit which detects a signal from the timing inductor 40. In the exemplified circuit, the timing detecting circuit 42 has a function to inform of a falling voltage. As a concrete example, the timing detecting circuit 42 may comprise a transistor Q0, a resistor R, and a diode D. The timing detecting circuit 42 detects a minimum of the oscillation voltage which is output from the timing inductor 40. With an output signal of the timing detecting circuit 42 as a trigger, the controller 22 outputs a control signal (gate voltage) which switches the transistor 26 from the OFF state to the ON state.

Figure 4:
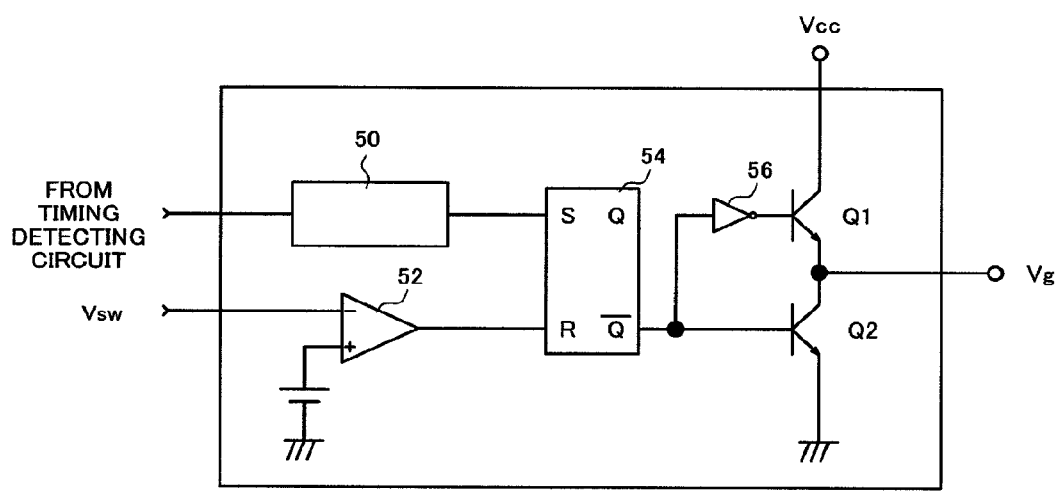
FIG. 4 is a diagram showing an example structure of a controller in the second preferred embodiment of the present invention.

As shown in FIG. 4, the controller 22 comprises, for example, a clock generator 50, a comparator 52, a flip-flop 54, a NOT element 56, and transistors Q1 and Q2.

The clock generator 50 outputs a pulse signal when the trigger is input from the timing detecting circuit 42. The pulse signal which is output from the clock generator 50 is input to a set terminal of the flip-flop 54. The flip-flop 54 is set when the pulse signal is input, and the inverted output of the flip-flop 54 becomes the low level. With this process, the transistor Q1 is set to the ON state and the transistor Q2 is set to the OFF state, and the gate voltage which is output from the output terminal OUT of the controller 22 to the gate of the transistor 26 becomes the high level. As a result, the transistor 26 is set to the ON state.

Figure 5:
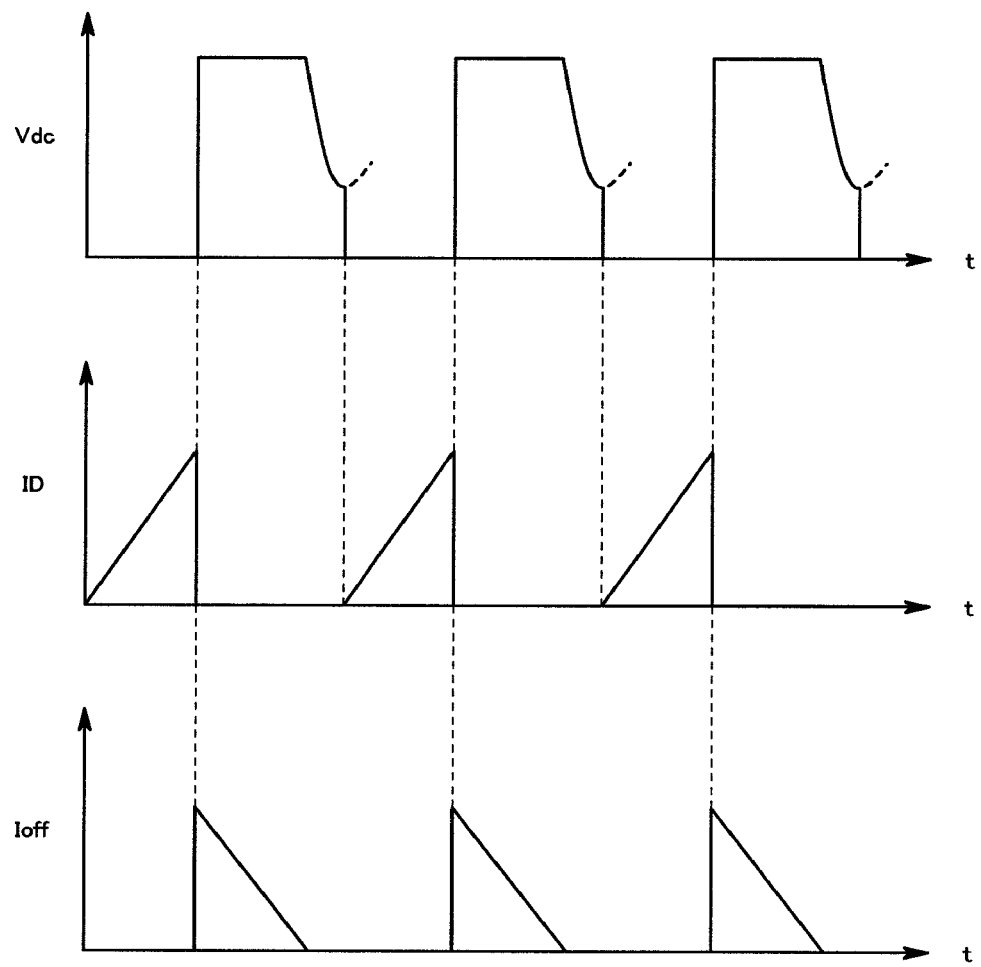
FIG. 5 is a diagram showing an operation of a driver circuit of a light-emitting element in the second preferred embodiment of the present invention.

In this process, as shown in FIG. 5, the voltage Vds between the drain and the source of the transistor 26 is reduced, and because of the current limiting action of the current limiting inductor 24, the current ID flowing through the series-connected structure 202 of the light-emitting elements and the current limiting inductor is gradually increased, and light is emitted from the light-emitting element.

In addition, when the transistor 26 is set to the ON state, with the increase in the current ID, the terminal voltage Vsw of the current detecting resistor Rsw is also gradually increased. The terminal voltage Vsw is compared at the comparator 52 with the reference voltage Vref, and when the terminal voltage Vsw becomes greater than or equal to the reference voltage Vref, the reset terminal of the flip-flop 54 is set to the high level. With this process, the flip-flop 54 is reset, and the inverted output becomes the high level. Consequently, the transistor Q1 is set to the OFF state and the transistor Q2 is set to the ON state, and the gate voltage which is output from the output terminal OUT of the controller 22 to the gate of the transistor 26 is set to the low level, and the transistor 26 is set to the OFF state.

As described, the controller 22 switches the gate voltage of the transistor 26 to the low level before the current ID exceeds the rated value of the light-emitting element. In this manner, by controlling the switching of the transistor 26 by the controller 22, it is possible to emit light while maintaining the current of the light-emitting element to a value less than or equal to the rated value by the function of the current limiting inductor 24.

As shown in FIG. 5, with the use of the timing inductor 40 and the timing detecting circuit 42, it is possible to detect a minimum of ringing of the power supply voltage Vds when the transistor 26 is switched from the ON state to the OFF state, and set the transistor 26 again to the ON state with the detection as a trigger. By setting the transistor 26 to the ON state at the timing when the ringing is minimum, it is possible to inhibit overlap of spike-like noise during rise of the current ID.

<Third Preferred Embodiment>

Figure 6:
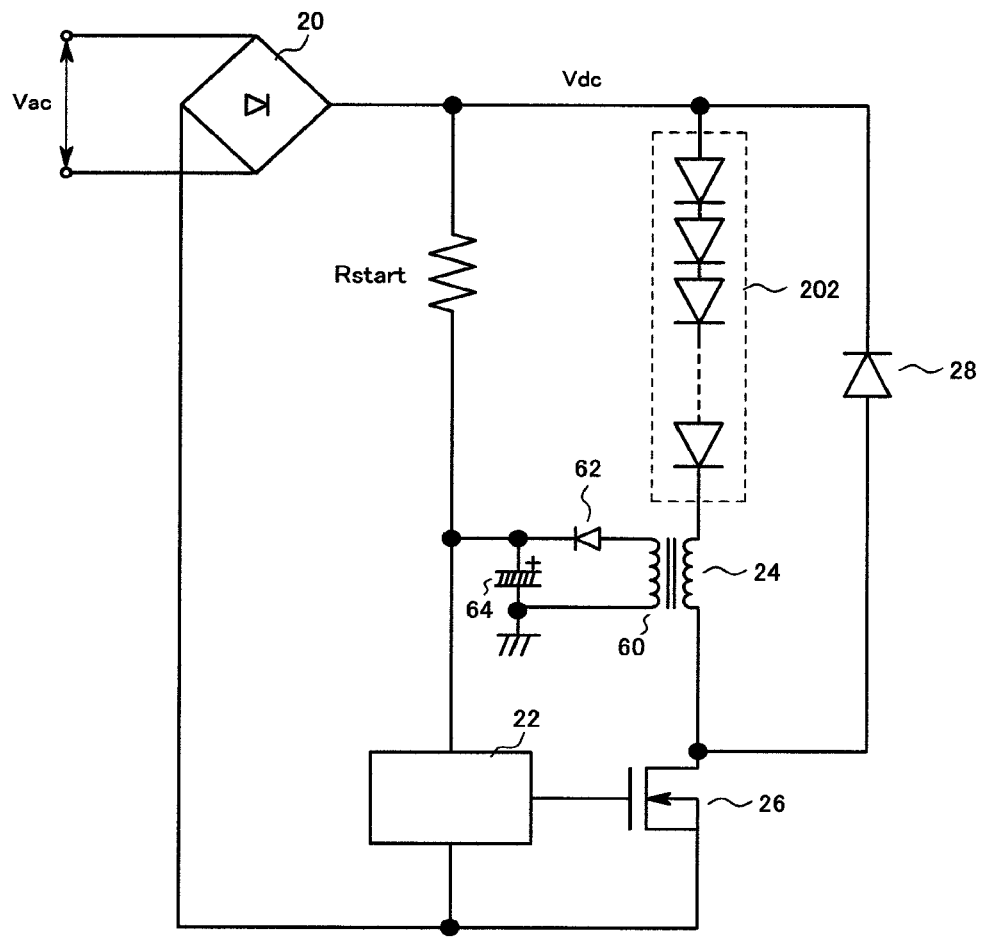
FIG. 6 is a diagram showing a structure of a driver circuit of a light-emitting element according to a third preferred embodiment of the present invention.
Figure 7:
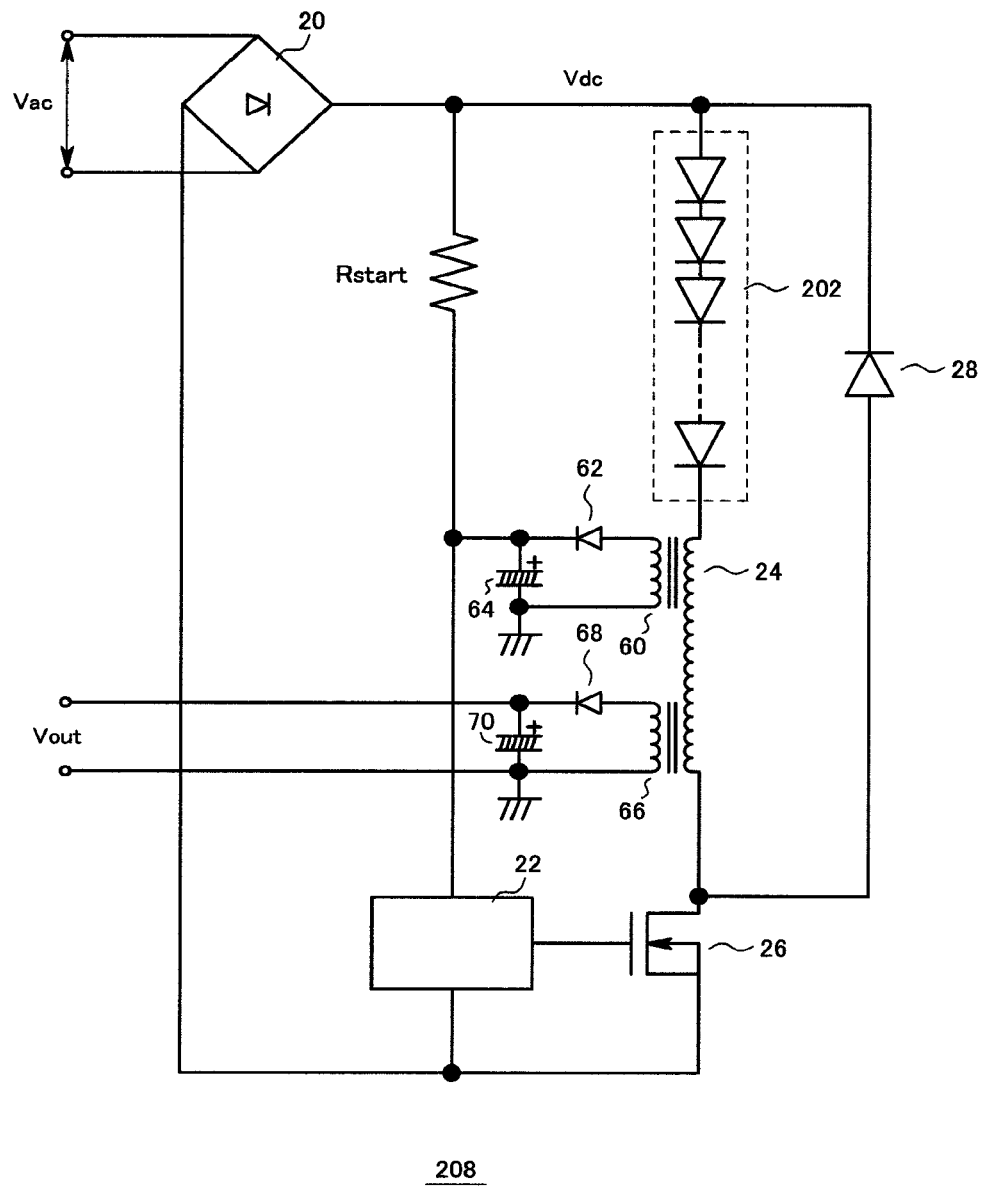
FIG. 7 is a diagram showing a structure of a driver circuit of a light-emitting element according to a fourth preferred embodiment of the present invention.
Figure 8:
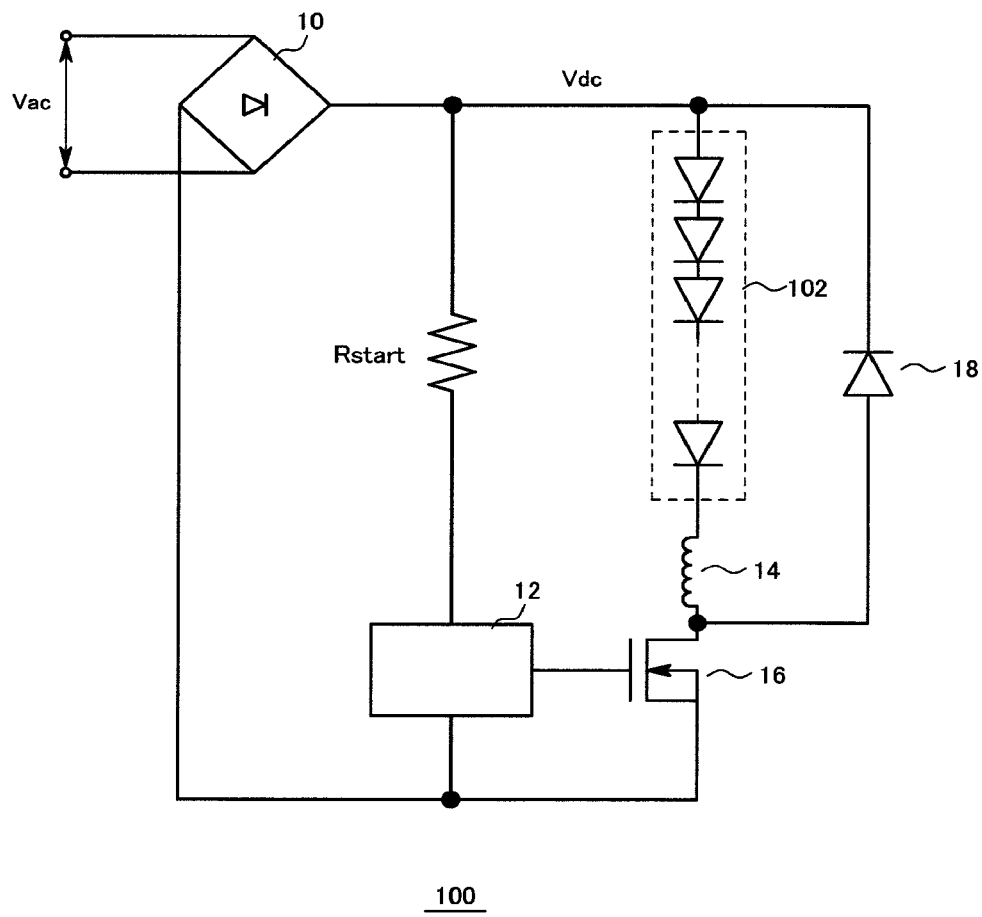
FIG. 8 is a diagram showing a structure of a driver circuit of a light-emitting element in related art.
Figure 9:
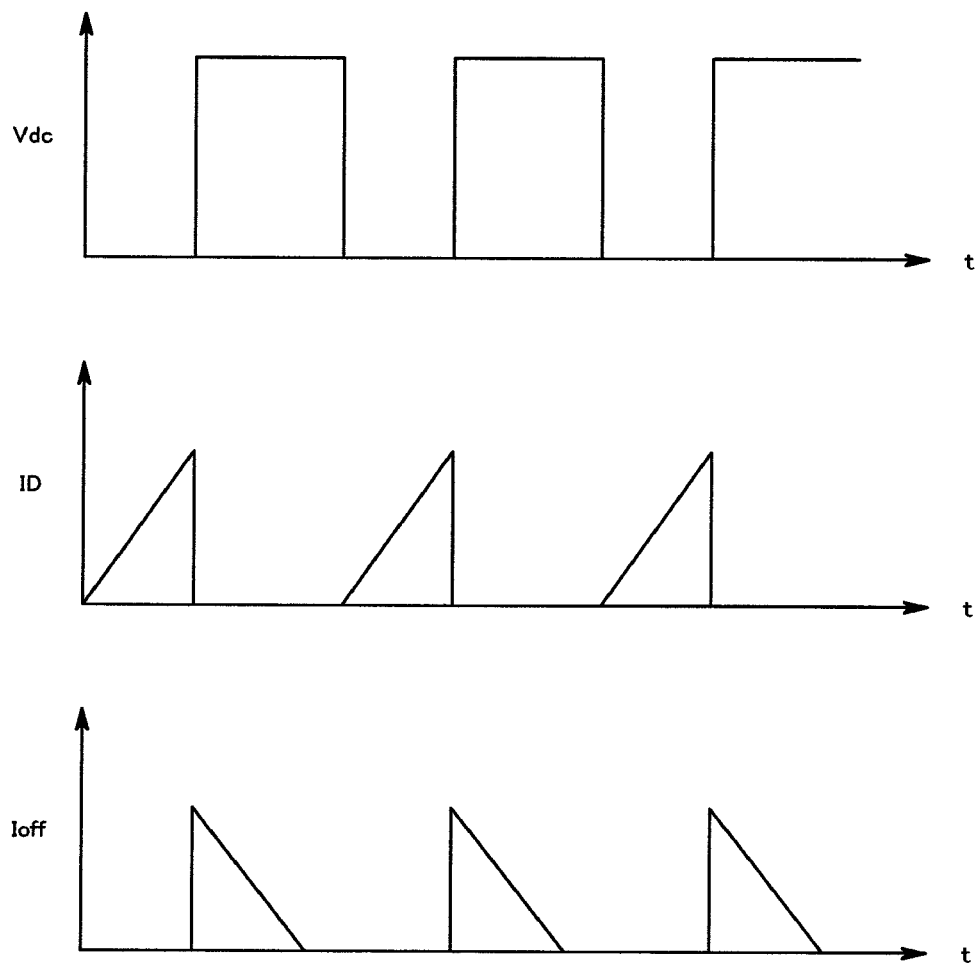
FIG. 9 is a diagram showing an operation of a driver circuit of a light-emitting element in related art.
Figure 10A:
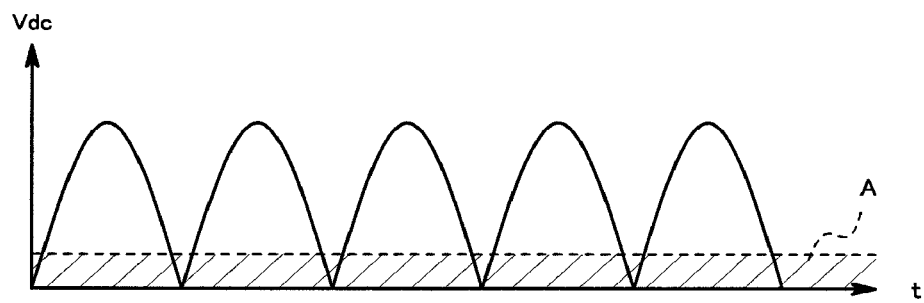
FIG. 10A is a diagram showing a change with respect to time of a power supply voltage.
Figure 10B:
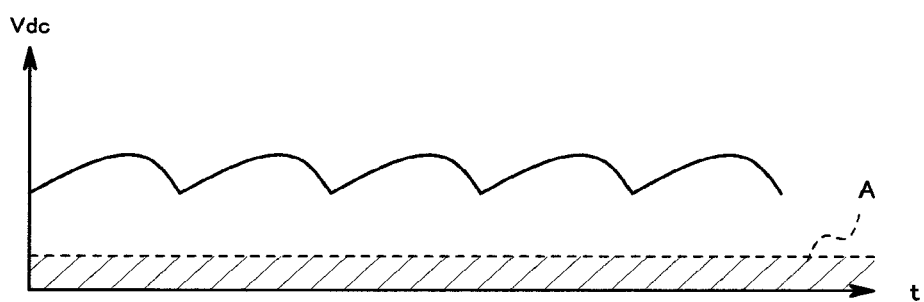
FIG. 10B is a diagram showing a change with respect to time of a power supply voltage.
Figure 11:
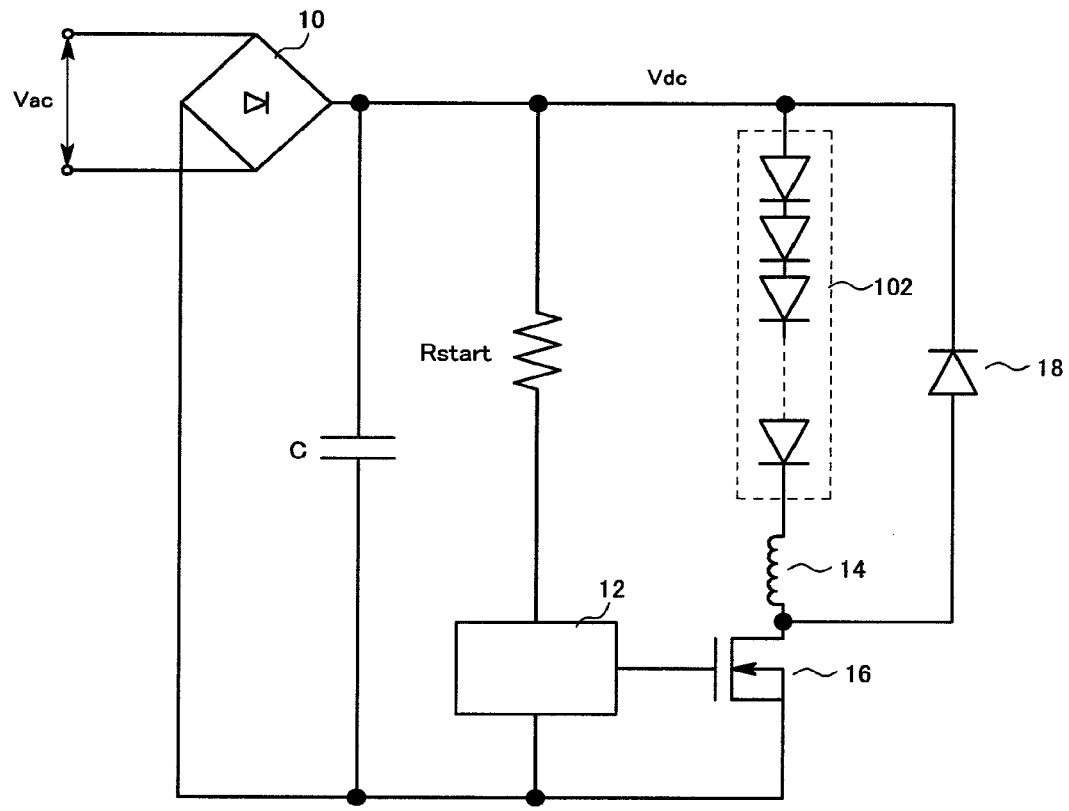
FIG. 11 is a diagram showing a structure of a driver circuit of a light-emitting element of related art in which abnormal oscillation is inhibited.
Figure 12:
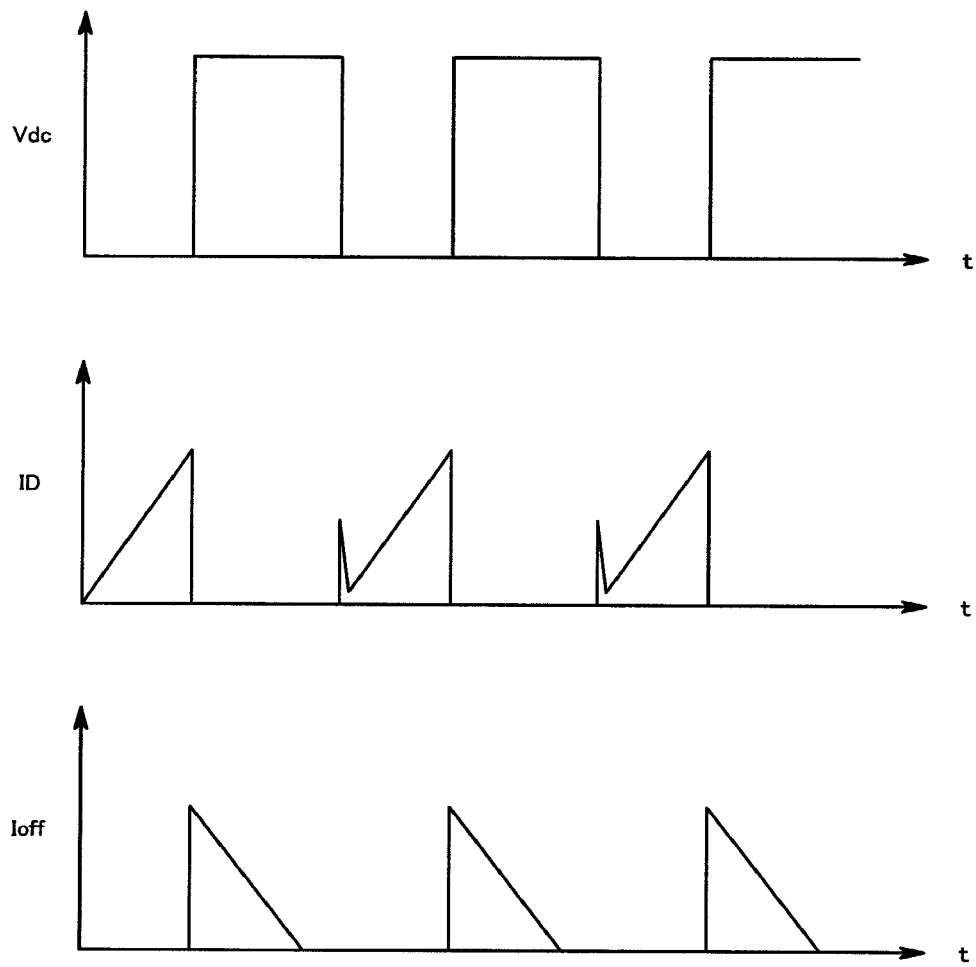
FIG. 12 is a diagram showing an operation of a driver circuit of light-emitting element in related art.

A driver circuit 206 according to a third preferred embodiment of the present invention comprises, as shown in FIG. 6, a rectifying bridge 20, a controller 22, a current limiting inductor 24, a transistor 26, a regenerative diode 28, a power supply inductor 60, a rectifying diode 62, and an averaging capacitor 64.

Constituent elements similar to those of the driver circuit 200 in the first preferred embodiment of the present invention are assigned the same reference numerals and will not be described again.

In the driver circuit 206 of the present embodiment, during regeneration, electric power of the power supply is supplied to the controller 22 through the power supply inductor 60. The power supply inductor 60 is electromagnetically coupled to the current limiting inductor 24. One terminal of the power supply inductor 60 is connected to an anode of the rectifying diode 62 and the other terminal of the power supply inductor 60 is grounded. A cathode of the rectifying diode 62 is connected to a power supply terminal of the controller 22. In order to stabilize the power supply supplied to the controller 22, it is possible to ground the cathode of the rectifying diode 62 through the averaging capacitor 64.

With such a structure, when the transistor 26 is set to the ON state and light is emitted from the light-emitting element, electromagnetic energy is stored in the current limiting inductor 24, and, when the transistor 26 is switched to the OFF state, the stored electromagnetic energy can be supplied as power supply of the controller 22 from the current limiting inductor 24 through the power supply inductor 60.

With this structure, the power consumption by the resistor Rstart can be inhibited, and the overall power efficiency of the driver circuit 206 can be improved.

<Fourth Preferred Embodiment>

In the third preferred embodiment, the power during regeneration is used as the electric power of power supply for the controller 22 by providing the power supply inductor 60, rectifying diode 62, and averaging capacitor 64. In the driver circuit 208 of a fourth preferred embodiment of the present invention, additionally, a power supply inductor 66, a rectifying diode 68, and an averaging capacitor 70 are provided, and are used as a power supply for circuits other than the controller 22.

In the driver circuit 208, the power supply inductor 66 is electromagnetically coupled to the current limiting inductor 24. One terminal of the power supply inductor 66 is connected to an anode of the rectifying diode 68, and the other terminal of the power supply inductor 66 is grounded. A cathode of the rectifying diode 68 is set as a supply terminal of power supply for an external circuit. In this configuration, in order to stabilize the power supply supplied to the external circuit, it is possible to ground the cathode of the rectifying diode 68 through the averaging capacitor 70.

With such a structure, when the transistor 26 is set to the ON state and light is emitted from the light-emitting element, electromagnetic energy is stored in the current limiting inductor 24, and, when the transistor 26 is switched to the OFF state, the stored electromagnetic energy can be supplied to the external circuit from the current limiting inductor 24 through the power supply inductor 66.

With this structure, the electromagnetic energy stored in the current limiting inductor 24 of the driver circuit 208 can be used in the external circuit, and thus the overall power efficiency of the driver circuit 208 can be improved.

What is claimed is:

1. A method for driving a light emitting unit, comprising:
providing the light emitting unit and a switching element, the light emitting unit having an input and an output, wherein the input comprises an anode of a light emitting diode and the output comprises a terminal of a first inductor, and the switching element coupled to the output of the light emitting unit;
providing a switching element having a control terminal and first and second conducting terminals, the first conducting terminal coupled to the second terminal of the light emitting unit;
providing a control element having a supply input coupled for receiving an inductor signal;
providing a second inductor having first and second terminals, the first terminal of the second inductor coupled to the first input of the first controller, the second inductor configured to be electromagnetically coupled to the first inductor;
providing a third inductor having first and second terminals, the third inductor configured to be electromagnetically coupled to the first inductor, and configured to provide energy stored in the third inductor to an external circuit;
providing a first voltage at the input of light emitting unit;
continuously monitoring the first voltage to generate a monitor signal;
generating an output signal from the light emitting unit in response to a state of the switching element; and
using the monitor signal to control the switching element in response to the first voltage.

2. The method of claim 1, further including setting the state of the switching element in response to control signal generated by a control element.

3. The method of claim 2, wherein using the monitor signal to control the switching element in response to the first voltage includes using the monitor signal to control the control element.

4. The method of claim 3, further including generating a comparison signal in response to comparing the monitor signal with a reference voltage.

5. The method of claim 4, further including generating a control signal in response to the comparison signal and using the control signal to control the control element.

6. The method of claim 5, wherein using the control signal to control the control element comprises configuring the control signal to turn off the switching element.

7. The method of claim 6, wherein generating the monitoring signal includes voltage dividing the first voltage to a form a divided voltage.

8. The method of claim 7, further including enabling the control element to control the switching element in response to the divided voltage being greater than the reference voltage.

9. The method of claim 8, further including generating a first current in response to turning on the switching element, wherein the first current flows through the light emitting unit.

10. The method of claim 6, further including disabling the control element from controlling the switching element in response to the divided voltage being less than the reference voltage.

11. The method of claim 2, wherein setting the state of the switching element comprises turning on the switching element, wherein a first current flows through the light emitting unit.

12. A method for driving a light emitting unit, comprising:
providing the light emitting unit having first and second terminals, wherein the first terminal comprises an anode of a light emitting diode and the second terminal comprises a terminal of an inductor;
providing a switching element having a control terminal and first and second conducting terminals, the first conducting terminal coupled to the second terminal of the light emitting unit;
providing a control element having a supply input coupled for receiving an inductor signal;
providing a first voltage at the input of light emitting unit;
using the first voltage to provide power to the control element in response to operating in a first operating mode;
configuring the switching element to be in an off state;
generating a regenerative signal in response to the switching element being in the off state;
generating a supply signal using a second inductor electromagnetically coupled to the first inductor;
using the supply signal to operate the control element;

electromagnetically coupling a third inductor to the first inductor; and supplying electromagnetic energy stored in the third inductor to an external circuit in response to switching the switching element to an off state.

13. The method of claim 12, further including:

detecting a ringing signal on the first voltage in response to turning off the switching element; and using the detected ringing signal as a trigger signal to turn on the switching element.

14. The method of claim 12, wherein providing the light emitting unit comprises providing one or more light emitting elements coupled in series with a first inductor.

15. The method of claim 14, further including:

detecting an inductor signal from the first inductor; and using the inductor signal to change a state of the switching element.

16. The method of claim 15, wherein changing the state of the switching element comprises turning on the switching element.

17. The method of claim 16, further including:

generating a current detection signal in response to turning on the switching element;

generating a comparison signal in response to comparing the current detection signal with a first reference voltage; and turning off the switching element in response to the comparison signal.

18. A driver circuit, comprising:

a series-connected unit having a light-emitting element having an input and an output and a first inductor having first and second terminals, the first terminal coupled to the output of the light-emitting element;

a switching element having a control terminal and first and second current conducting terminals;

a first controller having a first input and an output, the output coupled to the control terminal of the switching element;

a second inductor having first and second terminals, the first terminal of the second inductor coupled to the first input of the first controller, the second inductor configured to be electromagnetically coupled to the first inductor;

a third inductor having first and second terminals, the third inductor configured to be electromagnetically coupled to the first inductor, and configured to provide energy stored in the third inductor to an external circuit.

* * * * *